(12) United States Patent
Tamura et al.

(10) Patent No.: US 6,836,117 B2
(45) Date of Patent: Dec. 28, 2004

(54) LOWER ABDOMEN RF COIL AND MAGNETIC RESONANCE IMAGING APPARATUS

(75) Inventors: Mitsuru Tamura, Tokyo (JP); Akira Nabetani, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/414,625

(22) Filed: Apr. 16, 2003

(65) Prior Publication Data

US 2003/0197508 A1 Oct. 23, 2003

(30) Foreign Application Priority Data

Apr. 17, 2002 (JP) ........................................ 2002-114817

(51) Int. Cl.[7] .................................................. G01V 3/00
(52) U.S. Cl. ......................... 324/318; 600/410; 600/422
(58) Field of Search ................................ 324/318, 322, 324/309, 319; 600/410, 422

(56) References Cited

U.S. PATENT DOCUMENTS

| | | |
|---|---|---|
| 4,769,605 A | 9/1988 | Fox |
| 5,144,241 A | 9/1992 | Oppelt et al. |
| 5,144,243 A | 9/1992 | Nakabayashi et al. |
| 5,302,901 A | 4/1994 | Snelten |
| 5,361,765 A * | 11/1994 | Herlihy et al. ............... 600/422 |
| 5,473,251 A * | 12/1995 | Mori ........................... 324/318 |
| 5,594,337 A * | 1/1997 | Boskamp ..................... 324/318 |
| 5,708,361 A | 1/1998 | Wang et al. |
| 5,757,189 A * | 5/1998 | Molyneaux et al. ......... 324/318 |
| 5,973,495 A | 10/1999 | Mansfield |
| 6,097,186 A | 8/2000 | Nabetani |
| 6,137,291 A * | 10/2000 | Szumowski et al. ......... 324/318 |
| 6,300,761 B1 * | 10/2001 | Hagen et al. ................ 324/318 |
| 6,348,794 B1 | 2/2002 | Nabetani et al. |
| 6,438,402 B1 * | 8/2002 | Hashoian et al. ............ 600/410 |
| 6,591,128 B1 * | 7/2003 | Wu et al. ..................... 600/422 |
| 2003/0197508 A1 * | 10/2003 | Tamura et al. .............. 324/318 |

OTHER PUBLICATIONS

Jones "Twelve Antenna Element Lower Extremity/Pelvic Array for MRI" Proceedings of the International Society for Magnetic Resonance in Medicine Sixth Scientific Meeting and Exhibition vol. 1 ISSN 1065–9889 Sydney, Australia Apr. 18–24, 1998 p. 440.*

* cited by examiner

Primary Examiner—Diego Gutierrez
Assistant Examiner—Tiffany A. Fetzner
(74) Attorney, Agent, or Firm—Carl B. Horton, Esq.; Armstrong Teasdale LLP

(57) ABSTRACT

For the purpose of enabling proper imaging of the prostate, a first saddle coil 210 having two loop portions of a geometry suited for sandwiching the lower abdomen of a human body from the anterior and posterior sides with the two loop portions facing each other, and a second saddle coil 310 having two loop portions of a geometry suited for allowing the lower limbs of the human body to be inserted into the two loop portions, and sandwiching the lower abdomen from the right and left sides with the two loop portions facing each other, are quadrature-arranged so that the phases of magnetic resonance received signals are different by 90°, thus achieving imaging of the lower abdomen of the human body with a high S/N.

8 Claims, 14 Drawing Sheets

US 6,836,117 B2

LOWER ABDOMEN RF COIL AND MAGNETIC RESONANCE IMAGING APPARATUS

CROSS REFERENCE TO RELATED APPLICATIONS

This application claims the benefit of Japanese Application No. 2002-114817 filed Apr. 17, 2002.

BACKGROUND OF THE INVENTION

The present invention relates to an RF (radio frequency) coil, RF signal transmitting/receiving apparatus, RF signal receiving apparatus, and magnetic resonance imaging apparatus, and more particularly to an RF coil, RF signal transmitting/receiving apparatus, RF signal receiving apparatus, and magnetic resonance imaging apparatus for use in magnetic resonance imaging of the lower abdomen of a human body.

In a magnetic resonance imaging (MRI) apparatus, a subject to be imaged is carried into an internal space of a magnet system, i.e., an imaging space in which a static magnetic field is generated, a gradient magnetic field and a high frequency magnetic field are applied to generate a magnetic resonance signal by spins within the subject, and an image is reconstructed based on the received signal.

The high frequency magnetic field is applied as an RF pulse. The application of the RF pulse is sometimes referred to as transmission of an RF signal. The magnetic resonance signal is received as an RF signal. The RF signals are transmitted and received using an RF coil.

RF coils include one dedicated for transmission or reception, and one used both for transmission and reception. For the RF coil dedicated for reception or that used both for transmission and reception, various shapes of the RF coil are available depending upon a region to be imaged. One of such RF coils is an RF coil for imaging the prostate. This RF coil is a saddle coil having a geometry such that it sandwiches the lower abdomen of the subject from the anterior and posterior sides.

Since the prostate lies in the lowest portion of the lower abdomen, an image cannot always be obtained with a sufficiently good SNR (signal-to-noise ratio) even if such an RF coil is employed.

SUMMARY OF THE INVENTION

It is therefore an object of the present invention to provide an RF coil, RF signal transmitting/receiving apparatus, RF signal receiving apparatus, and magnetic resonance imaging apparatus that enable proper imaging of the prostate.

(1) The present invention, in accordance with one aspect thereof for solving the aforementioned problem, is an RF coil characterized in comprising: a first saddle coil having two loop portions of a geometry suited for sandwiching the lower abdomen of a human body from the anterior and posterior sides with the two loop portions facing each other; and a second saddle coil having two loop portions of a geometry suited for allowing the lower limbs of the human body to be inserted into the two loop portions, and sandwiching the lower abdomen from the right and left sides with the two loop portions facing each other.

(2) The present invention, in accordance with another aspect thereof for solving the aforementioned problem, is an RF signal transmitting/receiving apparatus characterized in comprising: a first saddle coil having two loop portions of a geometry suited for sandwiching the lower abdomen of a human body from the anterior and posterior sides with the two loop portions facing each other; a second saddle coil having two loop portions of a geometry suited for allowing the lower limbs of the human body to be inserted into the two loop portions, and sandwiching the lower abdomen from the right and left sides with the two loop portions facing each other; driving means for driving said first and second saddle coils in a quadrature scheme; and combining means for combining two RF signals respectively received by said first and second saddle coils in a quadrature scheme.

(3) The present invention, in accordance with still another aspect thereof for solving the aforementioned problem, is an RF signal receiving apparatus characterized in comprising: a first saddle coil having two loop portions of a geometry suited for sandwiching the lower abdomen of a human body from the anterior and posterior sides with the two loop portions facing each other; a second saddle coil having two loop portions of a geometry suited for allowing the lower limbs of the human body to be inserted into the two loop portions, and sandwiching the lower abdomen from the right and left sides with the two loop portions facing each other; and combining means for combining two RF signals respectively received by said first and second saddle coils in a quadrature scheme.

(4) The present invention, in accordance with still another aspect thereof for solving the aforementioned problem, is an RF signal receiving apparatus characterized in comprising: a first saddle coil having two loop portions of a geometry suited for sandwiching the lower abdomen of a human body from the anterior and posterior sides with the two loop portions facing each other; a second saddle coil having two loop portions of a geometry suited for allowing the lower limbs of the human body to be inserted into the two loop portions, and sandwiching the lower abdomen from the right and left sides with the two loop portions facing each other; and combining means for combining two RF signals respectively received by said first and second saddle coils in a phased-array scheme.

(5) The present invention, in accordance with still another aspect thereof for solving the aforementioned problem, is a magnetic resonance imaging apparatus having static magnetic field generating means for generating a static magnetic field in a space for accommodating a subject to be imaged, gradient magnetic field generating means for generating a gradient magnetic field in said space, RF signal receiving means for transmitting an RF signal to said space and receiving an RF signal from said space, and image producing means for producing an image based on said received RF signal, characterized in that: said RF signal transmitting/receiving means comprises a first saddle coil having two loop portions of a geometry suited for sandwiching the lower abdomen of a human body from the anterior and posterior sides with the two loop portions facing each other; a second saddle coil having two loop portions of a geometry suited for allowing the lower limbs of the human body to be inserted into the two loop portions, and sandwiching the lower abdomen from the right and left sides with the two loop portions facing each other; driving means for driving said first and second saddle coils in a quadrature scheme; and combining means for combining two RF signals respectively received by said first and second saddle coils in a quadrature scheme.

(6) The present invention, in accordance with still another aspect thereof for solving the aforementioned problem, is a magnetic resonance imaging apparatus having static magnetic field generating means for generating a static magnetic field in a space for accommodating a subject to be imaged, gradient magnetic field generating means for generating a gradient magnetic field in said space, RF signal transmitting means for transmitting an RF signal to said space, RF signal receiving means for receiving an RF signal from said space, and image producing means for producing an image based on said received RF signal, characterized in that: said RF signal receiving means comprises a first saddle coil having two loop portions of a geometry suited for sandwiching the lower abdomen of a human body from the anterior and posterior sides with the two loop portions facing each other; a second saddle coil having two loop portions of a geometry suited for allowing the lower limbs of the human body to be inserted into the two loop portions, and sandwiching the lower abdomen from the right and left sides with the two loop portions facing each other; and combining means for combining two RF signals respectively received by said first and second saddle coils in a quadrature scheme.

(7) The present invention, in accordance with still another aspect thereof for solving the aforementioned problem, is a magnetic resonance imaging apparatus having static magnetic field generating means for generating a static magnetic field in a space for accommodating a subject to be imaged, gradient magnetic field generating means for generating a gradient magnetic field in said space, RF signal transmitting means for transmitting an RF signal to said space, RF signal receiving means for receiving an RF signal from said space, and image producing means, for producing an image based on said received RF signal, characterized in that: said RF signal receiving means comprises a first saddle coil having two loop portions of a geometry suited for sandwiching the lower abdomen of a human body from the anterior and posterior sides with the two loop portions facing each other; a second saddle coil having two loop portions of a geometry suited for allowing the lower limbs of the human body to be inserted into the two loop portions, and sandwiching the lower abdomen from the right and left sides with the two loop portions facing each other; and combining means for combining two RF signals respectively received by said first and second saddle coils in a phased-array scheme.

In the invention of the aspects described in (1)–(7), an RF coil comprises a first saddle coil having two loop portions of a geometry suited for sandwiching the lower abdomen of a human body from the anterior and posterior sides with the two loop portions facing each other, and a second saddle coil having two loop portions of a geometry suited for allowing the lower limbs of the human body to be inserted into the two loop portions, and sandwiching the lower abdomen from the right and left sides with the two loop portions facing each other, so that magnetic resonance signals from the prostate portion can be received with a good SNR.

In the RF coil, said two loops in said second saddle coil preferably have a geometry, such that the two loops are made partially close to and facing each other along a medial line of said human body so that high-sensitivity regions in the first and second saddle coils coincide with each other.

The RF coil preferably comprises a flexible substrate having a geometry suited for being fitted over the lower abdomen of the human body, for supporting circuit patterns of said first and second saddle coils, so that fitting on the human body is improved.

(8) The present invention, in accordance with still another aspect thereof for solving the aforementioned problem, is an RF coil characterized in comprising: a first coil pair comprised of two loops of a geometry suited for sandwiching the lower abdomen of a human body from the anterior and posterior sides with the two loops facing each other; and a second coil pair comprised of two loops of a geometry suited for allowing the lower limbs of the human body to be inserted into the two loops, and sandwiching the lower abdomen from the right and left sides with the two loops facing each other.

(9) The present invention, in accordance with still another aspect thereof for solving the aforementioned problem, is an RF signal receiving apparatus characterized in comprising: a first coil pair comprised of two loops of a geometry suited for sandwiching the lower abdomen of a human body from the anterior and posterior sides with the two loops facing each other; a second coil pair comprised of two loops of a geometry suited for allowing the lower limbs of the human body to be inserted into the two loops, and sandwiching the lower abdomen from the right and left sides with the two loops facing each other; and combining means for combining two RF signals respectively received by said first and second coil pairs in a phased-array scheme.

(10) The present invention, in accordance with still another aspect thereof for solving the aforementioned problem, is a magnetic resonance imaging apparatus having static magnetic field generating means for generating a static magnetic field in a space for accommodating a subject to be imaged, gradient magnetic field generating means for generating a gradient magnetic field in said space, RF signal transmitting means for transmitting an RF signal to said space, RF signal receiving means for receiving an RF signal from said space, and image producing means for producing an image based on said received RF signal, characterized in that: said RF signal receiving means comprises a first coil pair comprised of two loops of a geometry suited for sandwiching the lower abdomen of a human body from the anterior and posterior sides with the two loops facing each other; a second coil pair comprised of two loops of a geometry suited for allowing the lower limbs of the human body to be inserted into the two loops, and sandwiching the lower abdomen from the right and left sides with the two loops facing each other; and combining means for combining two RF signals respectively received by said first and second coil pairs in a phased-array scheme.

In the invention of the aspects described in (8)–(10), an RF coil comprises a first coil pair comprised of two loops of a geometry suited for sandwiching the lower abdomen of a human body from the anterior and posterior sides with the two loops facing each other, and a second coil pair comprised of two loops of a geometry suited for allowing the lower limbs of the human body to be inserted into the two loops, and sandwiching the lower abdomen from the right and left sides with the two loops facing each other, so that magnetic resonance signals from the prostate portion can be received with a good SNR.

In the RF coil, said two loops in said second coil pair preferably have a geometry such that the two loops are made partially close to and facing each other along a medial line of said human body so that high-sensitivity regions in the first and second coil pairs coincide with each other.

The RF coil preferably comprises a flexible substrate having a geometry suited for being fitted over the lower abdomen of the human body, for supporting circuit patterns of said first and second coil pairs, so that fitting on the human body is improved.

Therefore, the present invention can provide an RF coil, RF signal transmitting/receiving apparatus, RF signal receiving apparatus, and magnetic resonance imaging apparatus that enable proper imaging of the prostate.

Further objects and advantages of the present invention will be apparent from the following description of the preferred embodiments of the invention as illustrated in the accompanying drawings.

DETAILED DESCRIPTION OF THE INVENTION

Figure 1:
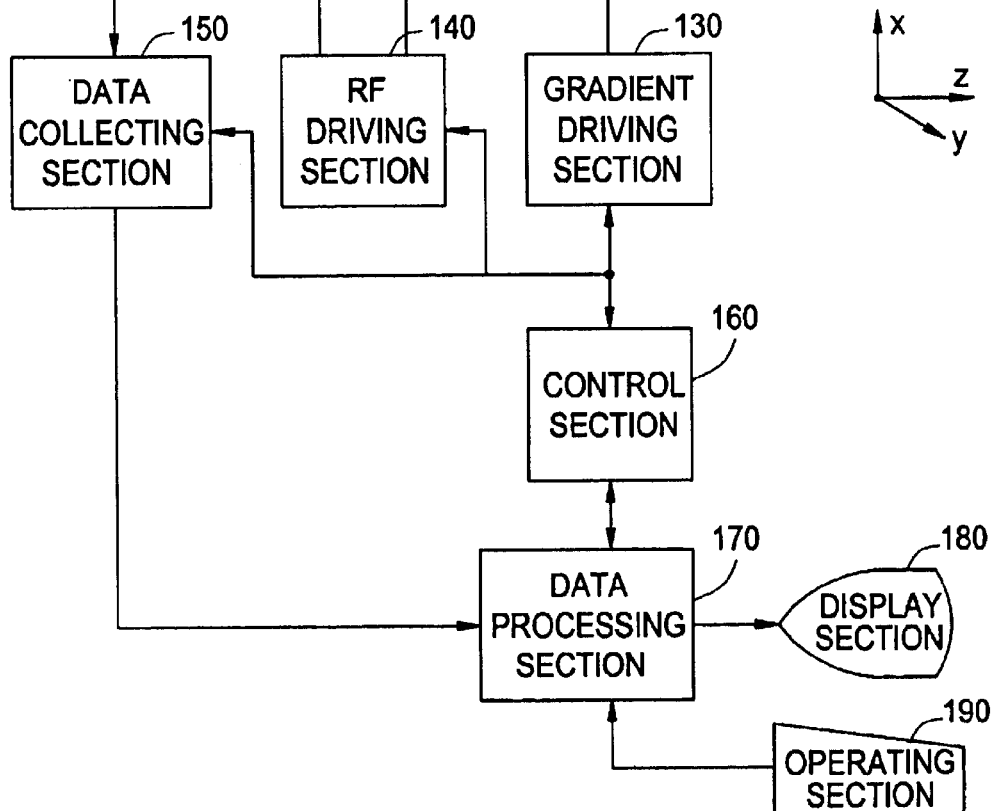
FIG. 1 is a block diagram of an apparatus in accordance with one embodiment of the present invention.

Embodiments of the present invention will now be described in detail with reference to the accompanying drawings. FIG. 1 shows a block diagram of a magnetic resonance imaging apparatus, which is an embodiment of the present invention. The configuration of the apparatus represents an embodiment of the apparatus in accordance with the present invention.

As shown in FIG. 1, the present apparatus has a magnet system 100. The magnet system 100 has a main magnetic field coil section 102, a gradient coil section 106, and an RF (radio frequency) coil section 108. These coil sections have a generally cylindrical shape and are concentrically disposed.

A subject to be imaged 1 is rested on a cradle 500 and carried into and out of a generally cylindrical internal space (bore) of the magnet system 100 by carrier means, which is not shown. The subject 1 is fitted at the lower abdomen with an RF coil section 110. The RF coil section 110 will be described later.

The main magnetic field coil section 102 generates a static magnetic field in the internal space of the magnet system 100. The direction of the static magnetic field is generally in parallel with the direction of the body axis of the subject 1. That is, a magnetic field commonly referred to as a horizontal magnetic field is generated. The main magnetic field coil section 102 is made using a superconductive coil, for example. It will be easily recognized that the main magnetic field coil section 102 is not limited to the superconductive coil, but may be made using a normal conductive coil or the like. The main magnetic field coil section 102 is one embodiment of the static magnetic field generating means in accordance with the present invention.

The gradient coil section 106 generates three gradient magnetic fields for imparting gradients to the static magnetic field strength in directions of three mutually perpendicular axes, i.e., a slice axis, a phase axis, and a frequency axis.

When mutually perpendicular coordinate axes in the static magnetic field space are represented as x, y, and z, any one of the axes can be the slice axis. In this case, one of the two remaining axes is the phase axis and the other is the frequency axis. Moreover, the slice, phase, and frequency axes can be given arbitrary inclination with respect to the x-, y-, and z-axes while maintaining their mutual perpendicularity. In the present apparatus, the direction of the body axis of the subject 1 is defined as the z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. In order to enable generation of such gradient magnetic fields, the gradient coil section 106 has three gradient coils, which are not shown. The gradient magnetic field will be sometimes referred to simply as the gradient hereinbelow.

The RF coil section 108 generates a high frequency magnetic field in the static magnetic field space for exciting spins within the subject 1. The generation of the high frequency magnetic field will be sometimes referred to as transmission of an RF excitation signal hereinbelow. Moreover, the RF excitation signal will be sometimes referred to as the RF pulse. The RF coil section 110 receives electromagnetic waves, i.e., magnetic resonance signals, generated by the excited spins. The RF coil section 110 can also transmit the RF excitation signal.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106. A portion including the gradient coil section 106 and gradient driving section 130 is one embodiment of the gradient magnetic field generating means in accordance with the present invention.

The RF coil sections 108 and 110 are connected with an RF driving section 140. The RF driving section 140 supplies driving signals to the RF coil section 108 or 110 to transmit the RF pulse, thereby exciting the spins within the subject 1. A portion including the RF coil sections 108 and 110 and RF driving section 140 is one embodiment of the RF signal transmitting means in accordance with the present invention.

The RF coil section 110 is connected with a data collecting section 150. The data collecting section 150 gathers receive signals received by the RF coil section 110 by sampling them, and collects the signals as digital data. A portion including the RF coil section 110, RE driving section 140 and data collecting section 150 is one embodiment of the RF signal transmitting/receiving means in accordance with the present invention.

The gradient driving section 130, RF driving section 140 and data collecting section 150 are connected with a control section 160. The control section 160 controls the gradient driving section 130, RF driving section 140 and data collecting section 150 to carry out imaging.

The control section 160 is, for example, constituted using a computer. The control section 160 has a memory, which is not shown. The memory stores programs for the control section 160 and several kinds of data. The function of the control section 160 is implemented by the computer executing a program stored in the memory.

The output of the data collecting section 150 is connected to a data processing section 170. Data collected by the data collecting section 150 is input to the data processing section 170. The data processing section 170 is, for example, constituted using a computer. The data processing section 170 has a memory, which is not shown. The memory stores programs for the data processing section 170 and several kinds of data.

The data processing section 170 is connected to the control section 160. The data processing section 170 is above the control section 160 and controls it. The function of the present apparatus is implemented by the data processing section 170 executing a program stored in the memory.

The data processing section 170 stores the data collected by the data collecting section 150 into the memory. A data space is established in the memory. The data space constitutes a two-dimensional Fourier space. The Fourier space will be sometimes referred to as a k-space hereinbelow. The data processing section 170 performs a two-dimensional inverse Fourier transformation on the data in the k-space to reconstruct an image of the subject 1. The data processing section 170 is one embodiment of the image producing means of the present invention.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image and several kinds of information output from the data processing section 170. The operating section 190 is operated by a user, and the section 190 inputs several commands, information and so forth to the data processing section 170. The user interactively operates the present apparatus via the display section 180 and operating section 190.

Figure 2:
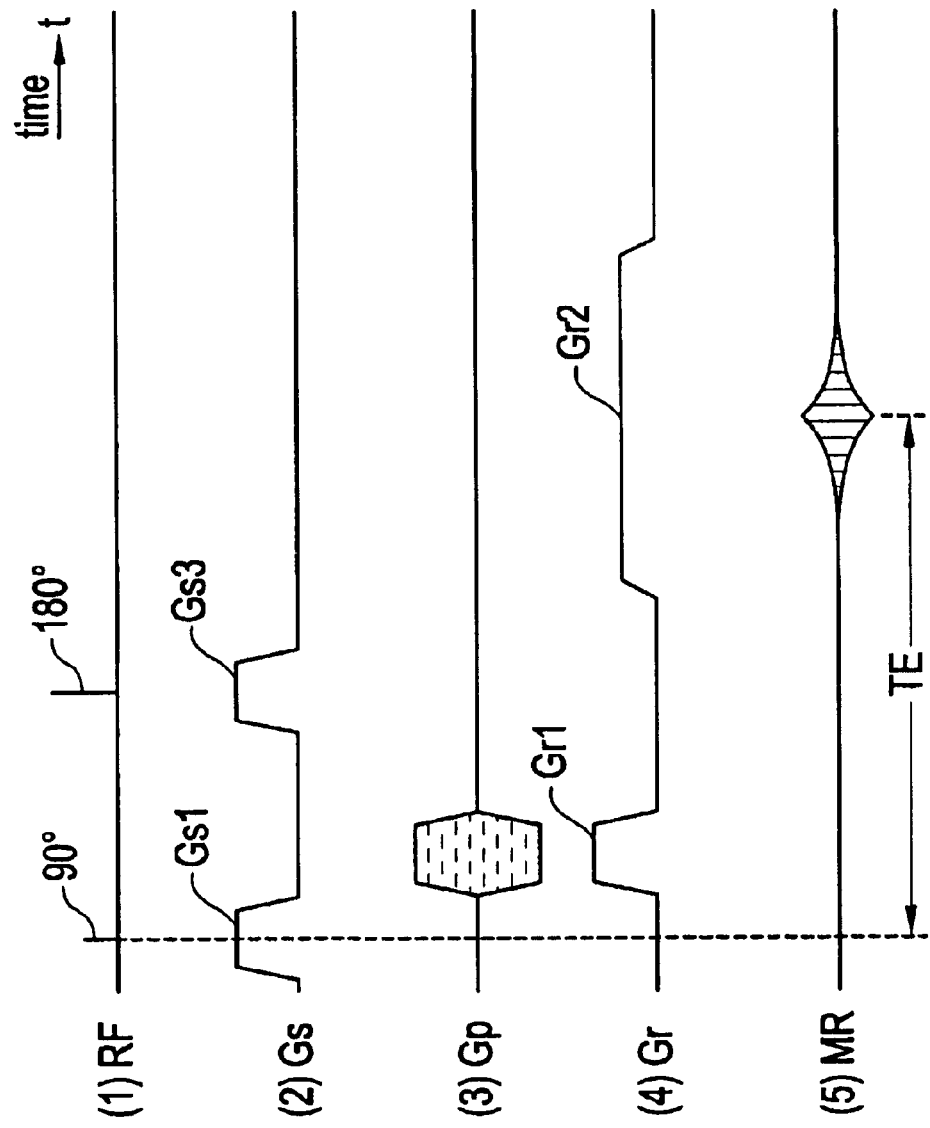
FIG. 2 is a diagram showing an exemplary pulse sequence for magnetic resonance imaging.

The imaging operation of the present apparatus will now be described. FIG. 2 shows an exemplary pulse sequence for use in magnetic resonance signal acquisition executed by the present apparatus. The pulse sequence is one for acquiring a spin echo, i.e., a pulse sequence according to a spin echo technique.

Specifically, FIG. 2(1) is a sequence of RF pulses, i.e., of 90° and 180° pulses, and (2), (3), (4), and (5) are sequences of a slice gradient Gs, phase encoding gradient Gp, readout gradient Gr, and spin echo MR, respectively. The 90° and 180° pulses are represented by their respective center signals. The pulse sequence proceeds along a time axis t from the left to the right.

As shown, the 90° and 180° pulses achieve 90° and 180° excitation of the spins, respectively. At the times of the 90° and 180° excitation, the respective slice gradients Gs1 and Gs3 are applied to perform selective excitation of a certain slice.

In the period between the 90° excitation and 180° excitation, phase encoding in the phase axis direction by the phase encoding gradient Gp and dephasing in the frequency axis direction by the readout gradient Gr1 are achieved.

After the 180° excitation, rephasing by the readout gradient Gr2 causes a spin echo MR to be generated. The spin echo MR is an RF signal having a waveform symmetrical with respect to an echo center. The echo center occurs after TE (echo time) from the 90° excitation. The spin echo MR is collected by the data collecting section 150 as view data.

Such a pulse sequence is repeated 64–256 times, for examples in a cycle TR (repetition time). The phase encoding gradient Gp in the phase axis direction is changed for each repetition. Broken lines conceptually represent the successive change of the phase encoding gradient Gp. Thus, view data are obtained for 64–256 views having different phase encoding in the phase axis direction. The view data thus obtained are collected into the k-space in the memory in the data processing section 170.

By performing a two-dimensional inverse Fourier transformation on the data in the k-space, two-dimensional image data in a real space, or a reconstructed image, is obtained. The image is displayed on the display section 180.

Figure 3:
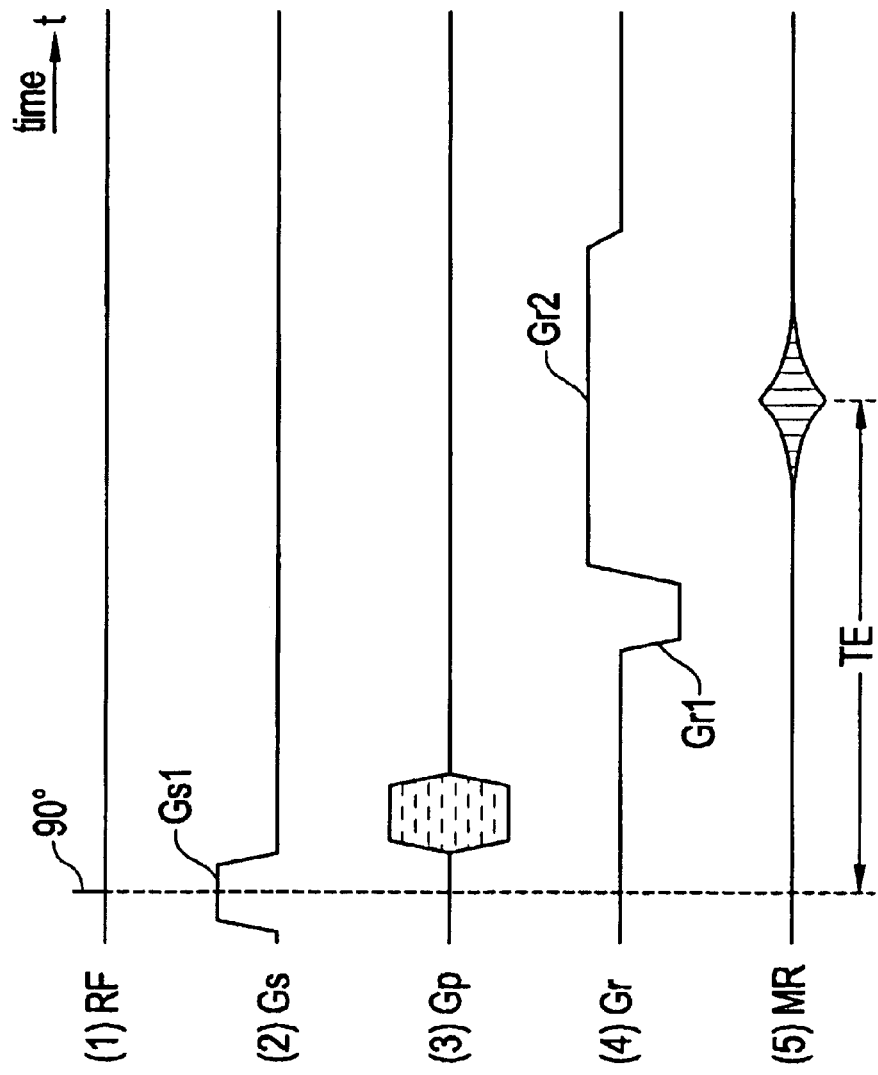
FIG. 3 is a diagram showing another exemplary pulse sequence for magnetic resonance imaging.

Another example of the pulse sequence for magnetic resonance signal acquisition executed by the present apparatus is shown in FIG. 3. This pulse sequence is one for acquiring a gradient echo, i.e., a pulse sequence according to a gradient echo technique.

FIG. 3(1) is a sequence of an RF pulse, i.e., of a 90° pulse, and (2), (3), (4), and (5) are sequences of a slice gradient Gs, phase encoding gradient Gp, readout gradient Gr, and gradient echo MR, respectively. The 90° pulse is represented by its central value. The pulse sequence proceeds along a time axis t from the left to the right.

As shown, the 90° pulse achieves 90° excitation of the spins. At the time of the 90° excitation, the slice gradient Gs1 is applied to achieve selective excitation for a certain slice. After the 90° excitation, phase encoding in the phase axis direction is achieved by the phase encoding gradient Gp.

Thereafter, dephasing in the frequency axis direction is achieved by the readout gradient Gr1, and subsequent rephasing by the readout gradient Gr2 causes a gradient echo MR to be generated.

The gradient echo MR is an RF signal having a waveform symmetrical with respect to an echo center. The echo center occurs after TE from the 90° excitation. The gradient echo MR is collected by the data collecting section 150 as view data.

Such a pulse sequence is repeated 64–256 times in a cycle of TR. The phase encoding gradient Gp in the phase axis direction is changed for each repetition. Broken lines conceptually represent the successive change of the phase encoding gradient Gp. Thus, view data are obtained for 64–256 views having different phase encoding in the phase axis direction. The view data thus obtained are collected into the k-space in the memory in the data processing section 170.

By performing a two-dimensional inverse Fourier transformation on the data in the k-space, two-dimensional image data in a real space, or a reconstructed image, is obtained. The image is displayed on the display section 180.

Figure 4:
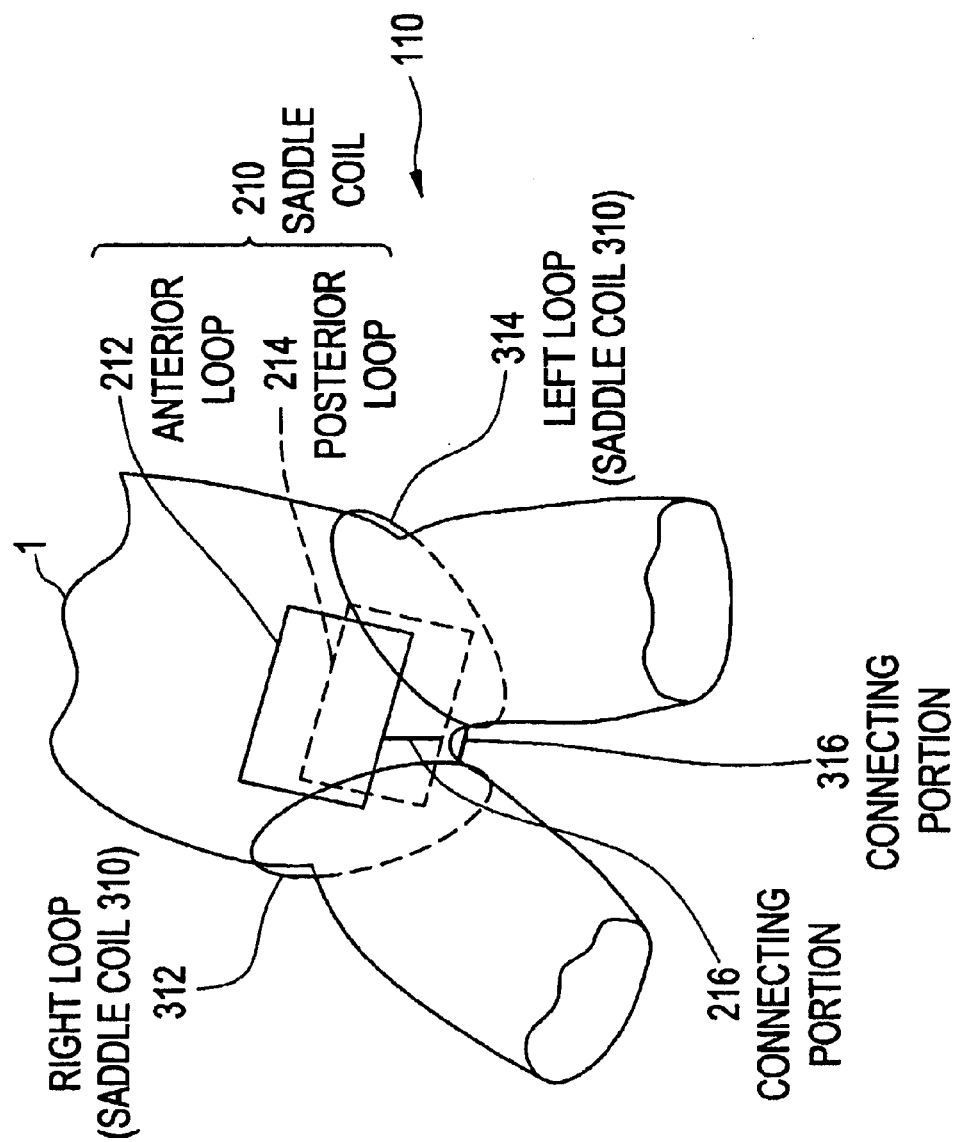
FIG. 4 is a schematic view showing the condition of an RF coil fitted over a subject.
Figure 5:
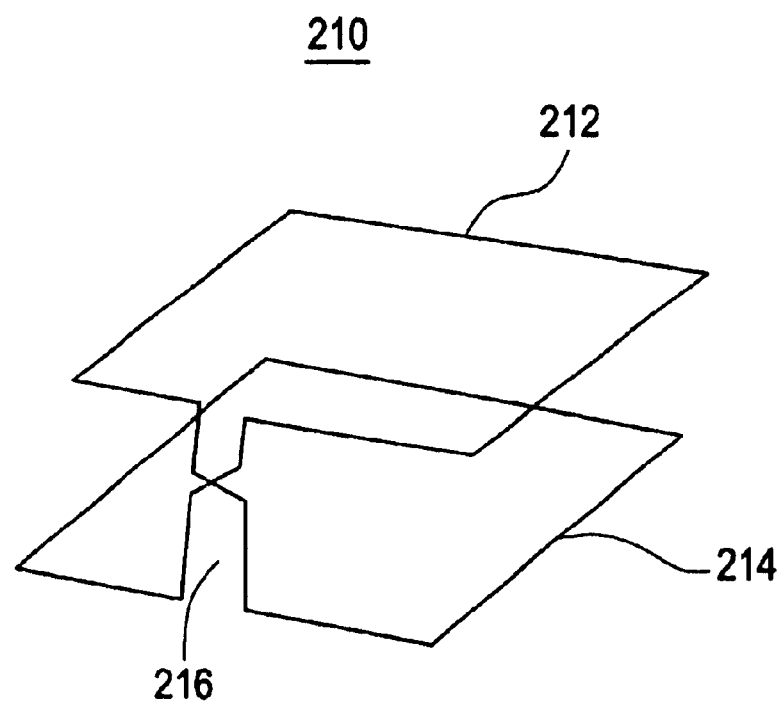
FIG. 5 is a schematic view of one saddle coil.

FIG. 4 schematically shows the RF coil section 110 fitted over the subject 1. As shown, the RF coil section 110 has an anterior loop 212 and a posterior loop 214 facing each other to sandwich therebetween the lower abdomen of the subject 1 from the anterior and posterior sides. The anterior and posterior loops 212 and 214 are connected to each other via a connecting portion 216. The connecting portion 216 is comprised of two electric paths crossing in the middle portion as shown in FIG. 5, and thus, the anterior and posterior loops 212 and 214 constitute a saddle coil 210 to form one closed loop. The saddle coil 210 is one embodiment of the first saddle coil in accordance with the present invention. The connecting portion 216 may be comprised of two parallel electric paths not crossing in the middle portion, to connect the anterior and posterior loops 212 and 214 in parallel.

From the electrical viewpoint, the saddle coil 210 is an LC circuit having capacitors in series as well known in the art, although the capacitors are omitted in the drawing. Electric power supply to and electric signal take-out from the saddle coil 210 are made across a capacitor as well known in the art, although these are also omitted in the drawing.

Figure 6:
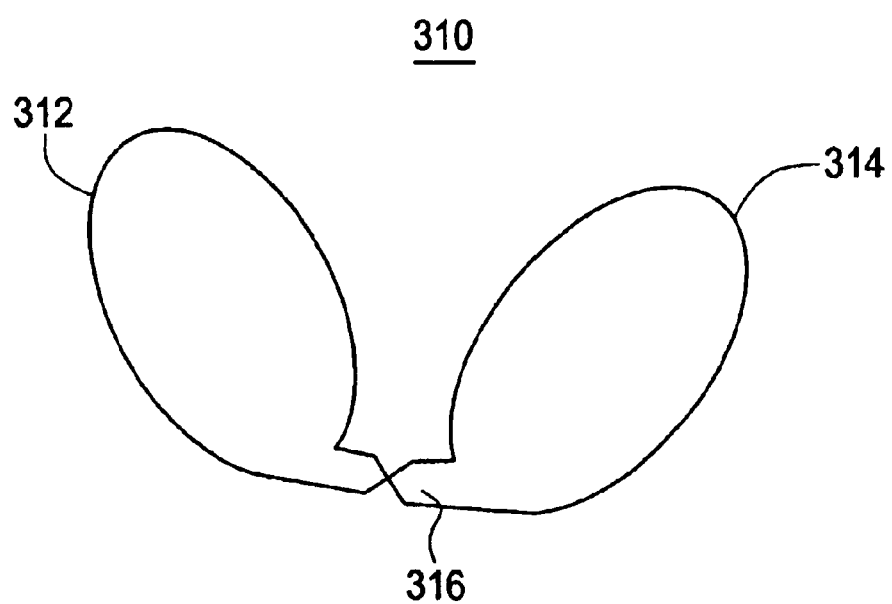
FIG. 6 is a schematic view of the other saddle coil.

The RF coil section 110 also has an right loop 312 and a left loop 314 that allow insertion of the lower limbs of the human body and face each other to sandwich therebetween the lower abdomen from the right and left sides. The right and left loops 312 and 314 are connected to each other via a connecting portion 316. The connecting portion 316 is comprised of two electric paths crossing in the middle portion as shown in FIG. 6, and thus, the right and left loops 312 and 314 constitute a saddle coil 310 to form one closed loop. The saddle coil 310 is one embodiment of the second saddle coil in accordance with the present invention. The connecting portion 316 may be comprised of two parallel electric paths not crossing in the middle portion, to connect the right and left loops 312 and 314 in parallel.

Again, in an electrical aspect, the saddle coil 310 is also an LC circuit having capacitors in series as well known in the art, although the capacitors are omitted in the drawing. Electric power supply to and electric signal take-out from the saddle coil 310 are made across a capacitor as well known in the art, although these are also omitted in the drawing.

Figure 7:
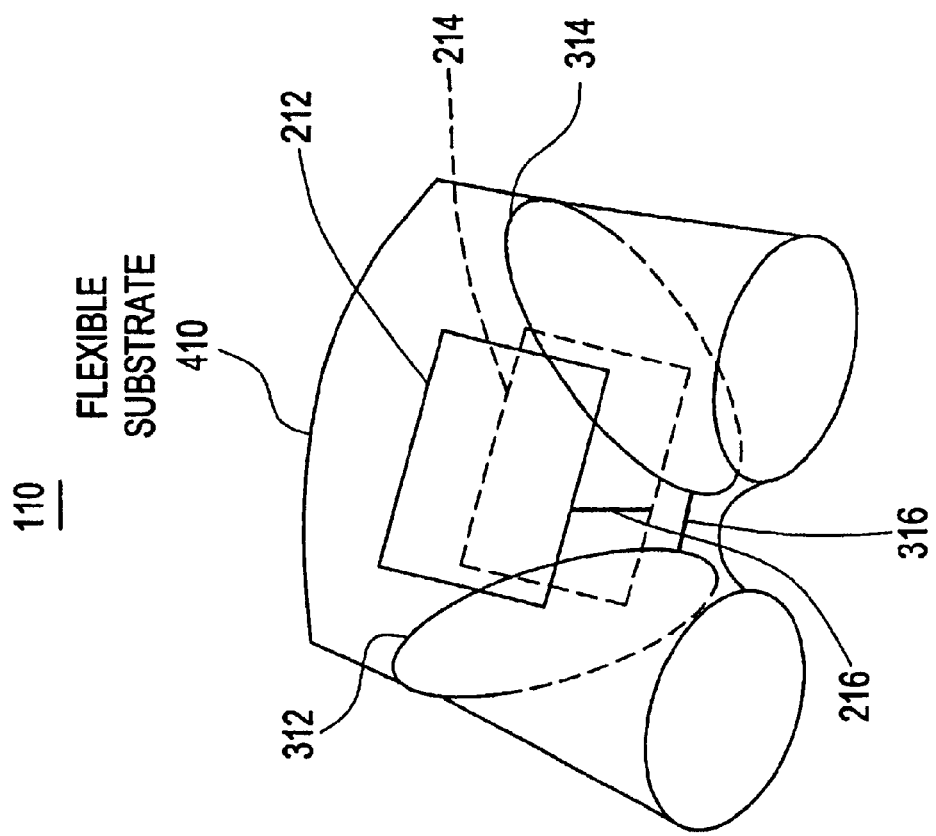
FIG. 7 is a schematic view of an RF coil.

The circuit patterns of the saddle coils 210 and 310 are provided on a flexible substrate 410, as exemplary shown in FIG. 7. As shown, the flexible substrate 410 has an underwear-like shape such that it can be fitted over the lower abdomen of the subject 1. The flexible substrate 410 is one embodiment of the flexible substrate in accordance with the present invention.

Figure 8:
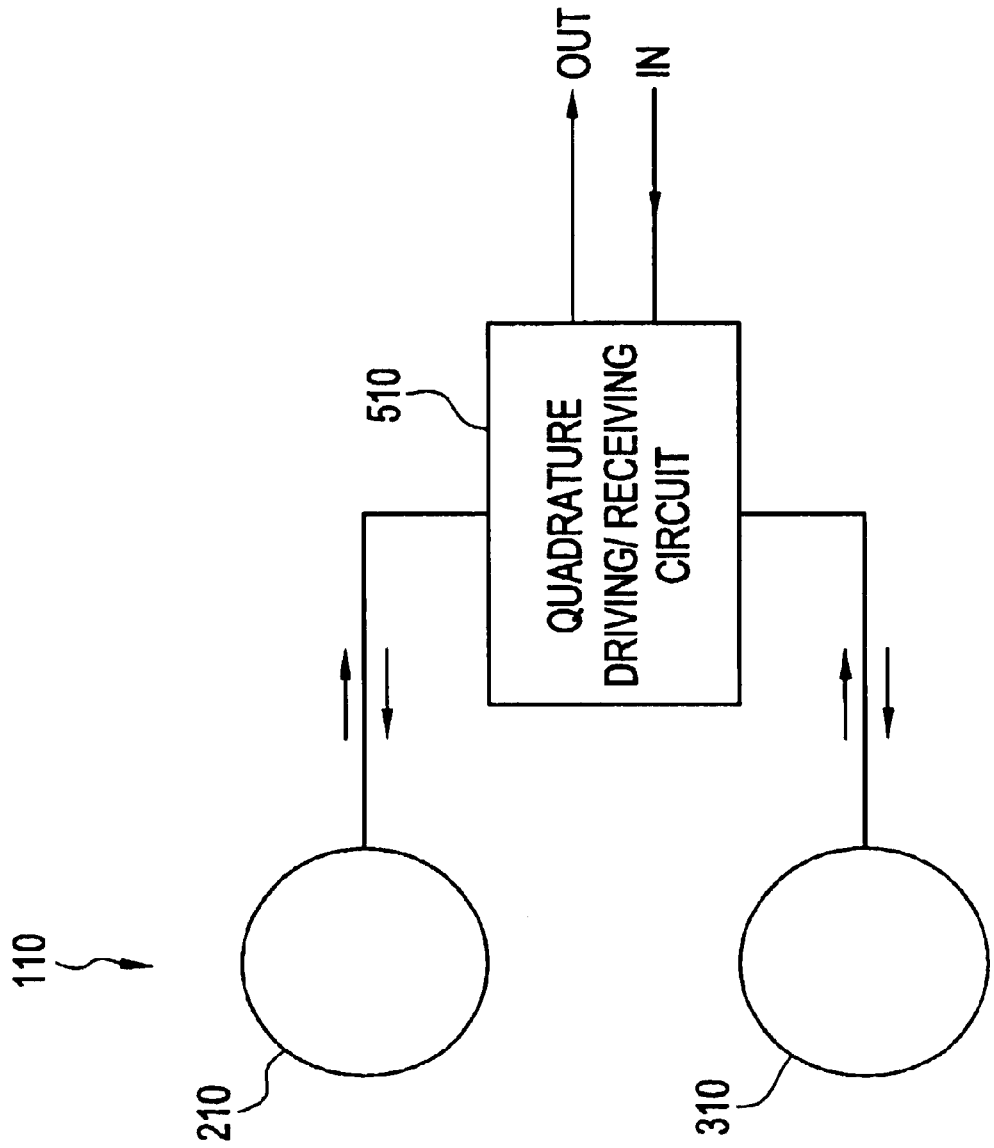
FIG. 8 is a block diagram of an RF transmitting/receiving system.

FIG. 8 shows a block diagram of an electrical configuration when the RF coil section 110 is employed both for transmission and reception of RF signals. As shown, the saddle coils 210 and 310 are connected with a quadrature driving/receiving circuit 510.

A driving circuit portion in the quadrature driving/receiving circuit 510 corresponds to the RF driving section 140 shown in FIG. 1. A receiving circuit portion in the quadrature driving/receiving circuit 510 corresponds to part of the data collecting section 150 shown in FIG. 1.

In transmitting an RF signal, the saddle coils 210 and 310 are quadrature-driven by the quadrature driving/receiving circuit 510. Specifically, the saddle coils 210 and 310 are respectively driven by two RF signals having a phase difference of 90°. The quadrature driving/receiving circuit 510 is one embodiment of the driving means in accordance with the present invention. It is also one embodiment of the combining means in accordance with the present invention.

Moreover, magnetic resonance signals received by the saddle coils 210 and 310 are quadrature-received by the quadrature driving/receiving circuit 510. Specifically, a signal representing the vector sum of two magnetic resonance signals having a phase difference of 90° received respectively by the saddle coils 210 and 310 is received. Since such drive/reception in the quadrature scheme improves the SNR of magnetic resonance signals, an image of the prostate can be captured with good quality.

Alternatively, the transmission of an RF signal may be conducted by the RF coil section 108 and RF driving section 140, and the saddle coils 210 and 310 and quadrature driving/receiving circuit 510 may conduct only reception.

Figure 9:
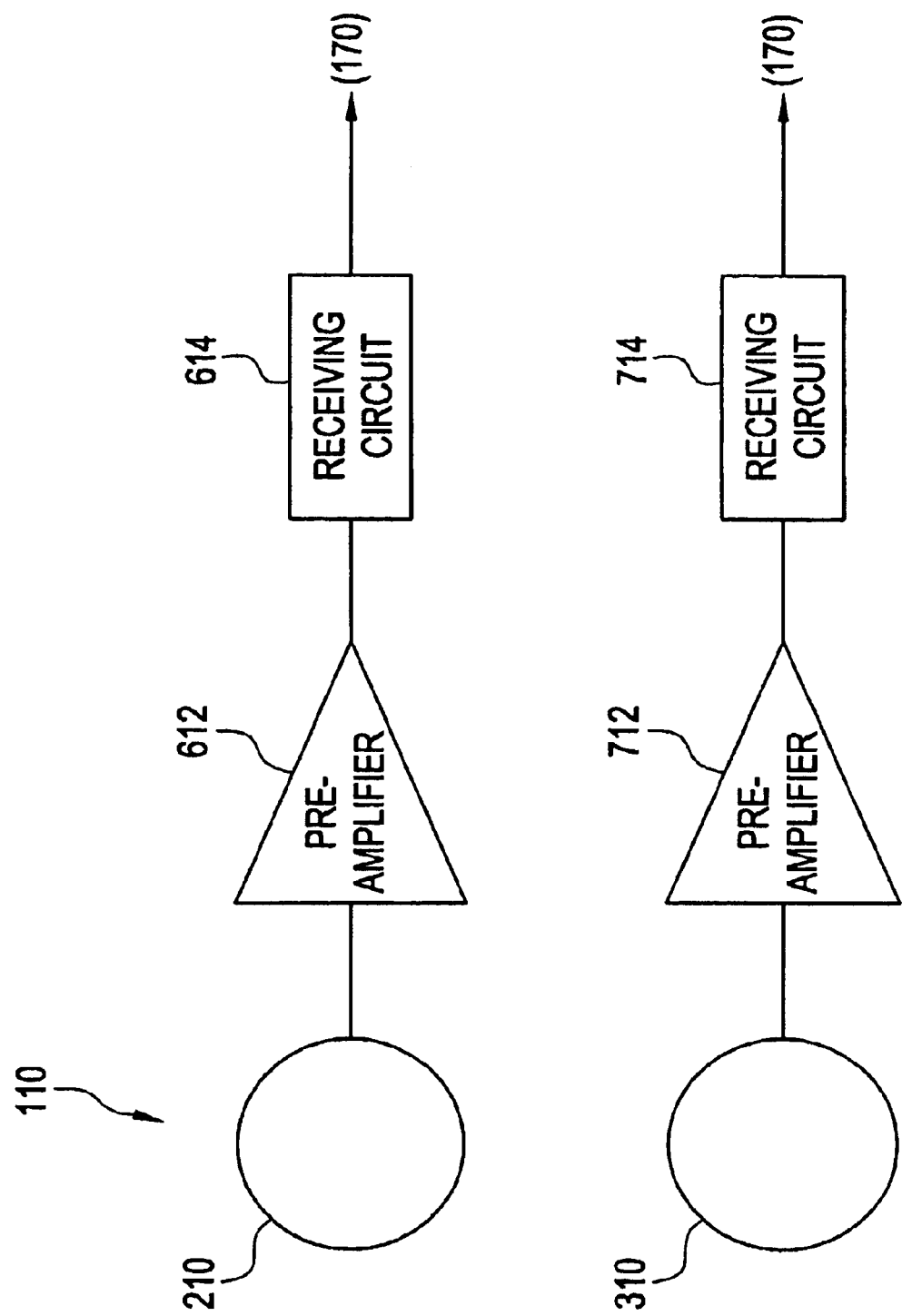
FIG. 9 is a block diagram of an RF receiving system.

FIG. 9 shows a block diagram of another exemplary electrical configuration when the RF coil section 110 is employed only for reception of an RF signal. If the RF coil section 110 is dedicated for reception, the RF transmission is conducted by the RF coil section 108 and RF driving section 140.

As shown, a signal received by the saddle coil 210 is amplified by a preamplifier 612 and received by a receiving circuit 614, and a signal received by the saddle coil 310 is amplified by a preamplifier 712 and received by a receiving circuit 714. The signals received by the receiving circuits 614 and 714 are input to the data processing section 170 and combined in a phased-array scheme at the data processing section 170. The data processing section 170 is one embodiment of the combining circuit in accordance with the present invention. The preamplifiers 612 and 712 and receiving circuits 614 and 714 correspond to part of the data collecting section 150.

By thus combining the received signals from the two saddle coils in the phased-array scheme, the SNR of the magnetic resonance signal is improved. Therefore, an image of the prostate can be captured with good quality.

Figure 10:
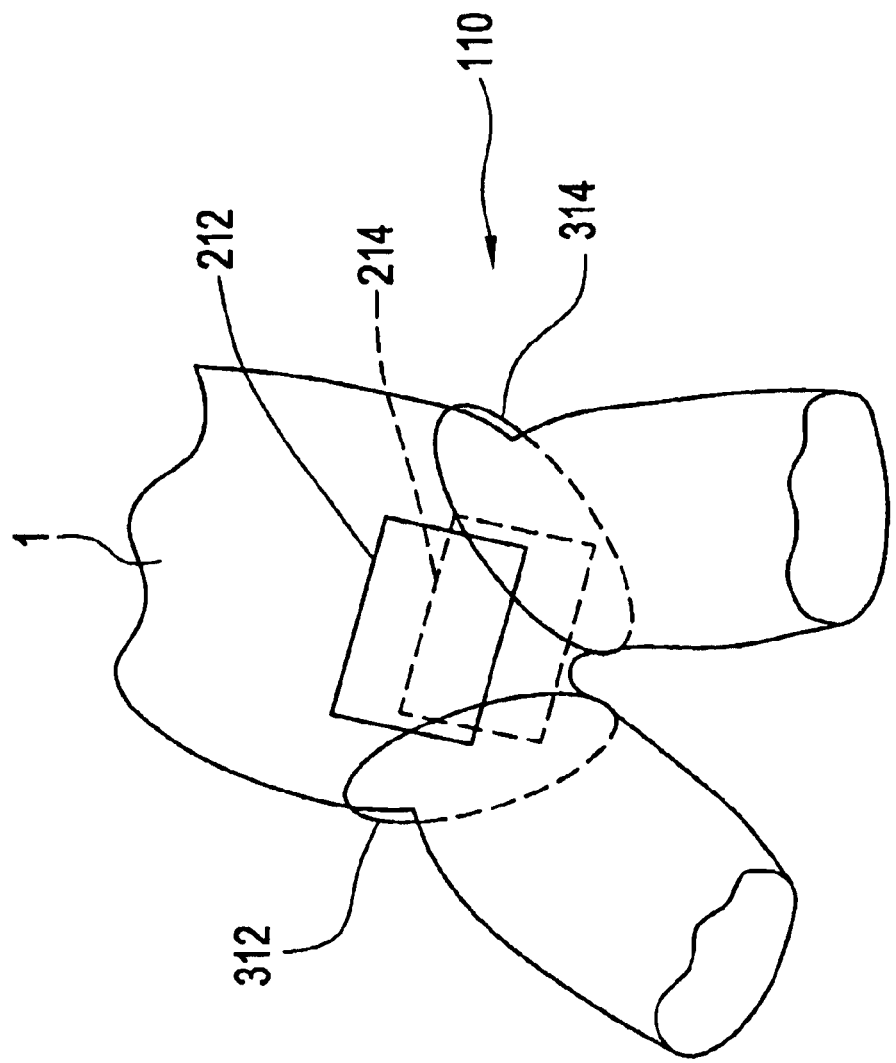
FIG. 10 is a schematic view showing the condition of the RF coil fitted over the subject.

The anterior and posterior loops 212 and 214, and the right and left loops 312 and 314 each may be separate loops, as exemplarily shown in FIG. 10. The anterior and posterior loops 212 and 214 represent one embodiment of the first coil pair in accordance with the present invention. The right and left loops 312 and 314 represent one embodiment of the second coil pair in accordance with the present invention. These loops are also preferably provided on the underwear-like flexible substrate 410 as shown in FIG. 7 so that they can be easily fitted over the subject 1.

Figure 11:
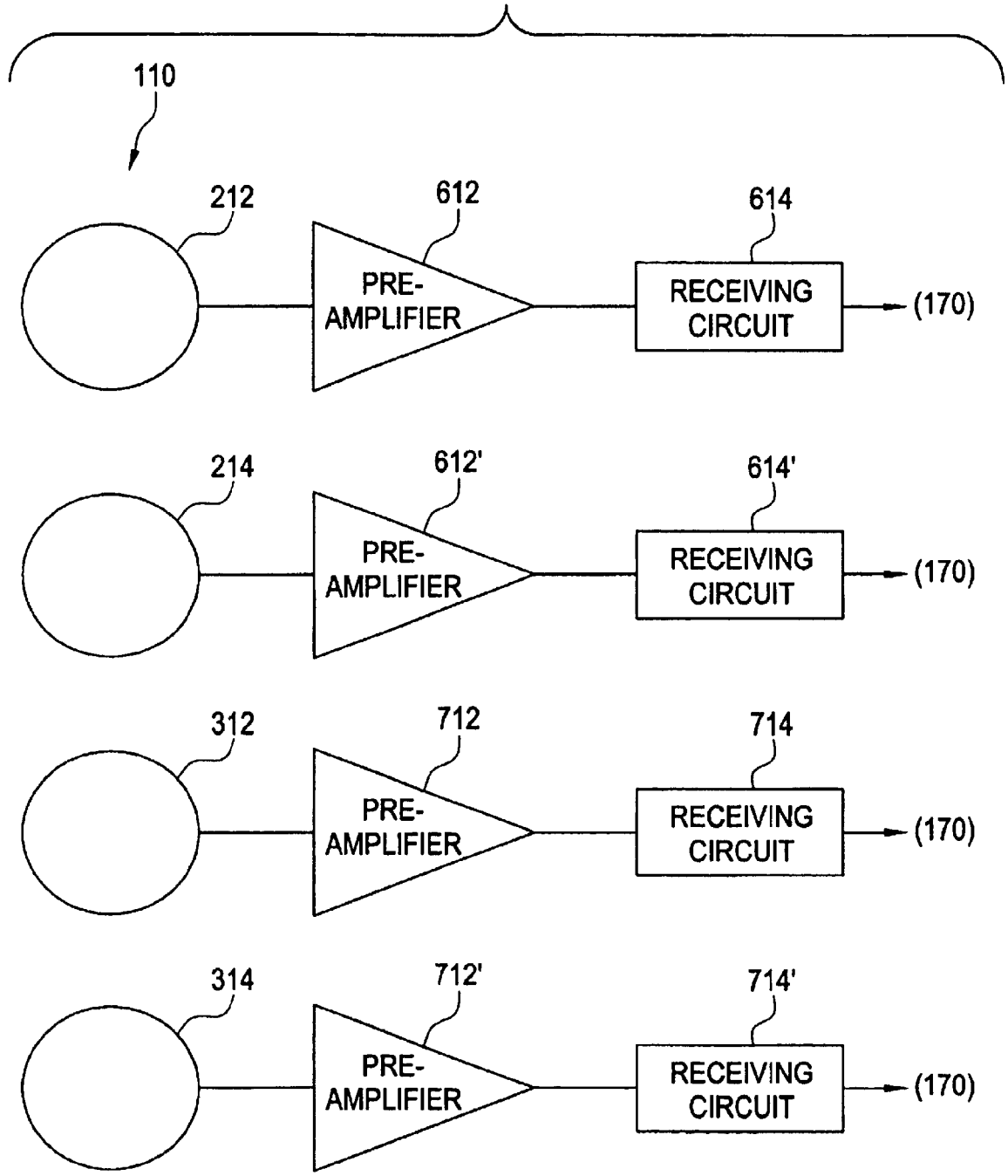
FIG. 11 is a block diagram of an RF receiving system.

When the individual loops are separate, signals received by the loops are received by respective receiver systems each comprised of a preamplifier and a receiving circuit, and the received signals are combined in the phased-array scheme at the data processing section 170, as exemplarily shown in FIG. 11. For instance, a signal is received by anterior loop 212 coupled to pre-amplifier 612 that is coupled to receiving circuit 614. A signal is received by posterior loop 214 coupled to a pre-amplifier 612' that is coupled to a receiving circuit 614'. A signal is received by right loop 312 coupled to pre-amplifier 712 that is coupled to receiving circuit 714. A signal is received by left loon 314 coupled to a pre-amplifier 712' that is coupled to a receiving circuit 714'. RF coil section 110 includes anterior loop 212, posterior loon 214, right loop 312, and left loop 314.

Figure 12:
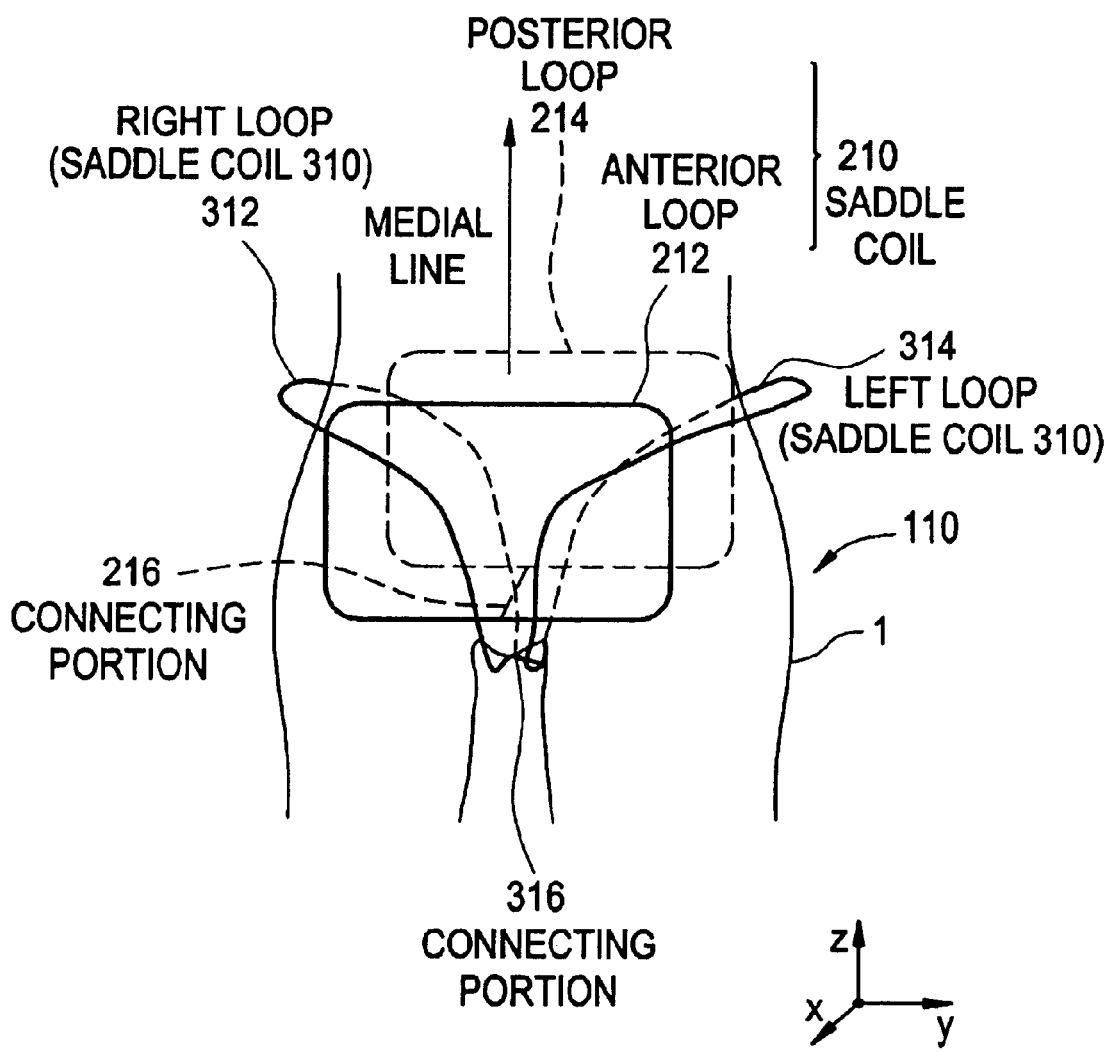
FIG. 12 is a schematic view showing the condition of the RF coil fitted over the subject.
Figure 13:
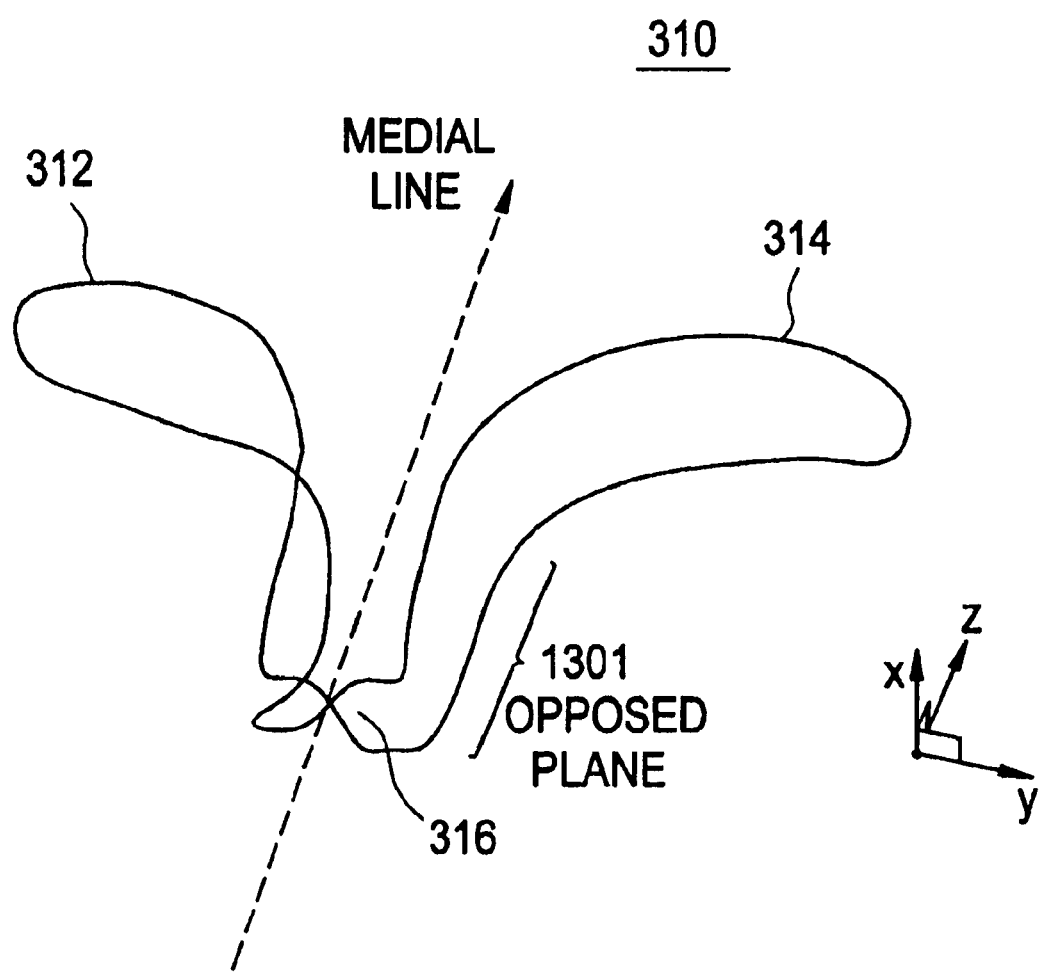
FIG. 13 is a schematic view of one saddle coil.

The right and left loops 312 and 314 may have a geometry such that the loops are made partially close to and facing each other, as exemplarily shown in FIG. 12. FIG. 13 shows the geometry when the right and left loops 312 and 314 constitute the saddle coil 310. The right and left loops 312 and 314 in the saddle coil 310 are connected by the connecting portion 316, which connects the right and left loops 312 and 314 in a butterfly shape to form one closed loop. The connecting portion 316 is not limited to that forming the butterfly shape, and may connect the loops 312 and 314 in parallel to form two closed loops. The positional relationship of the saddle coil 310 in the magnetic resonance imaging apparatus can be recognized by comparing coordinate axes with those in FIG. 1. The x-, y- and z-axes in FIG. 1 are expressed so that the y-z plane perpendicular to the x-axis is obliquely shown in a bird's-eye view for clarity of illustration, but strictly, the y-z plane perpendicular to the x-axis matches the z-axis.

In an electrical aspect, the saddle coil 310 is an LC circuit having capacitors in series as well known in the art, although the capacitors are omitted in the drawing. Electric power supply to and electric signal take-out from the saddle coil 310 are made across a capacitor as well known in the art, although these are also omitted in the drawing.

The circuit patterns of the saddle coils 210 and 310 are provided on a flexible substrate. The flexible substrate has an underwear-like shape such that it can be fitted over the lower abdomen of the subject 1. The flexible substrate is one embodiment of the flexible substrate in accordance with the present invention.

Figure 14A:
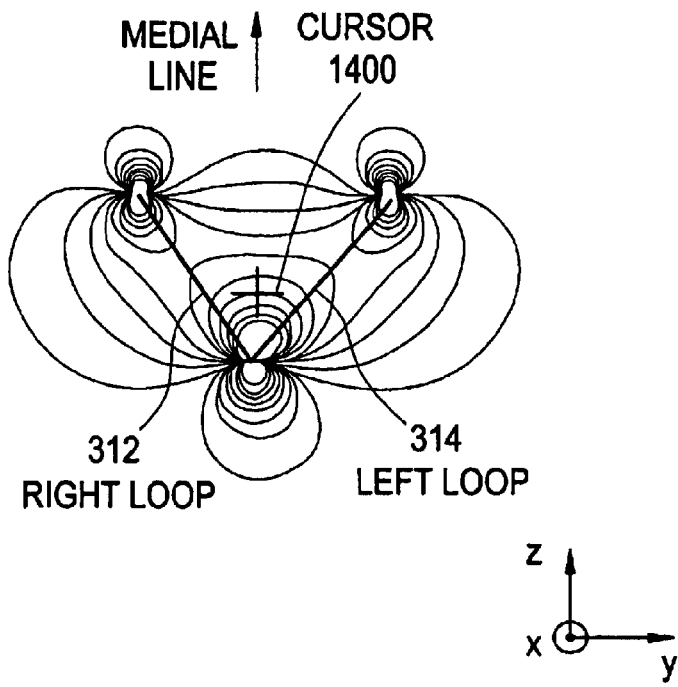
FIG. 14 shows contour representations of the excitation magnetic flux strength of saddle coils.
Figure 14B:
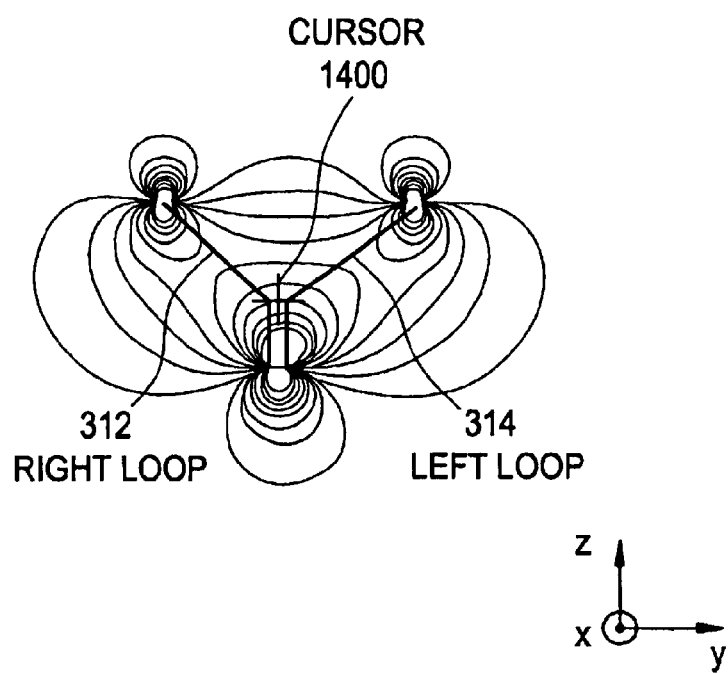
Figure 15:
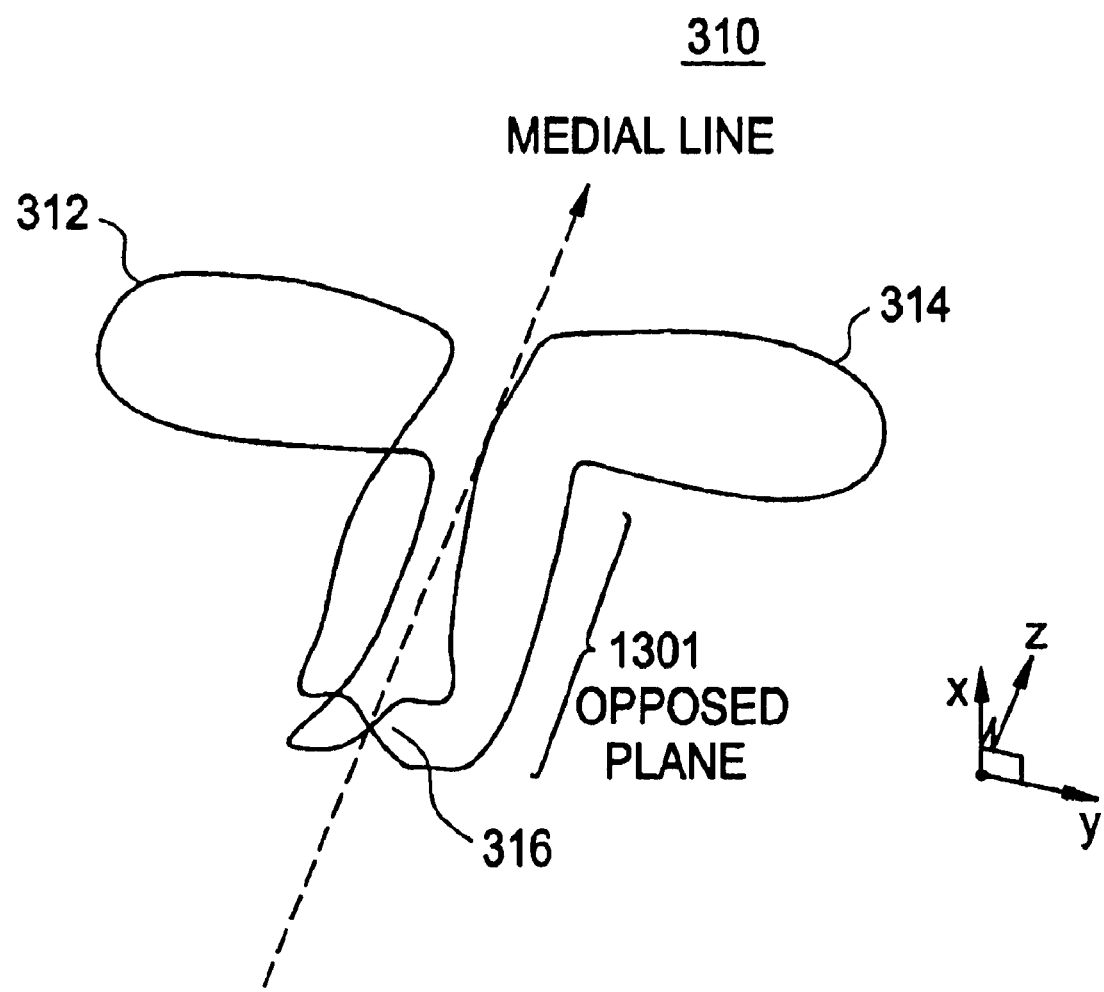
FIG. 15 is a schematic view of one saddle coil.

Loop planes of the right and left loops 312 and 314, as shown in FIGS. 14A and 14B, form opposed planes 1301, as shown in FIG. 15, extending from the connecting portion 316 (FIG. 15), close to each other along the medial line. The excitation magnetic flux strength of right loop 312 and left loop 314 is shown in FIGS. 14A and 14B using a contour representation in the y-z plane. FIG. 14A is an exemplary contour representation of the excitation magnetic flux strength by the right and left loops 312 and 314 of the geometry not facing each other along the medial line. FIG. 14B is another exemplary contour representation of the excitation magnetic flux strength by the right and left loops 312 and 314 partially close to and facing each other along the medial line. Bold solid lines in FIG. 14A and FIG. 14B represent the geometry of the right and left loops 312 and 314 projected in the x-direction and the crosses in FIG. 14A and FIG. 14B represent a cursor 1400 indicating the location of the prostate to be imaged by the operator, which designate the same position in FIGS. 14A and 14B.

The contours shown in FIGS. 14(A) and (B) express the excitation magnetic flux strength in a range between 0.5–5.0 $\mu$T/A (microTesla per Ampere) at intervals of 0.5 $\mu$T/A. A portion with dense contours has a greater magnetic flux strength than that with coarse contours. Thus, the excitation magnetic flux strength near the cursor 1400 on the medial line is 3.81 $\mu$T/A in FIG. 14(B), as compared with that of 3.43 $\mu$T/A in FIG. 14(A), which means that the excitation magnetic flux strength increasingly varies.

Since the right and left loops 312 and 314 partially close to and facing each other increase the excitation magnetic flux strength in the saddle coil 310 at the cursor 1400 position, the sensitivity is therefore improved. Moreover, since the cursor 1400 position lies in the high-sensitivity region of the saddle coil 210, the SNR of the magnetic resonance signals is further improved when, for example, the signals are combined by the drive/reception in the quadrature scheme, thereby enabling an image of the prostate to be captured with better quality.

The length of the opposed planes 1301 along the medial line may be increased as shown in FIG. 15 so that the right and left loops 312 and 314 projected in the x-direction form a T-shape. Thus, the sensitivity at the cursor 1400 position can be further improved.

While the right and left loops 312 and 314 close to and facing each other are configured to form the saddle coil 310, they may be formed as separate loops to be one embodiment of the second coil pair in accordance with the present invention. In this case, a flexible substrate for supporting the first and second coil pairs and combining means for combining the first and second coil pairs in the phased-array scheme are provided.

While the present invention has been described with reference to preferred embodiments hereinabove, various changes or substitutions may be made on these embodiments by those ordinarily skilled in the art pertinent to the present invention without departing from the technical scope of the present invention. Therefore, the technical scope of the present invention encompasses not only those embodiments described above but all that fall within the scope of the appended claims.

What is claimed is:

1. An RF imaging coil comprising:
   a first RF saddle coil having a first set of two loop portions of a geometry configured to sandwich a lower abdomen of a human body from anterior and posterior sides with the two loop portions of the first set facing each other; and
   a second RF saddle coil having a second set of two loop portions of a geometry configured to allow insertion of lower limbs of the human body into the two loop portions of the second set and configured to sandwich the lower abdomen above the lower limbs from the right and left sides with the two loop portions of the second set facing each other, wherein said first and second RF saddle coils cooperate during imaging and said second RF saddle coil is separate from said first RF saddle coil.

2. The RF imaging coil of claim 1, wherein said two loop portions of the second set in said second RF saddle coil have a geometry such that the two loop portions of the second set are made partially close to and facing each other along a medial line of said human body, wherein a signal-to-noise ratio is improved, and wherein the two loop portions of the second set have a sensitivity that is improved.

3. The RF imaging coil of claim 1, further comprising: a flexible substrate having a geometry of an underwear shape and configured to fit over the lower abdomen of the human body, and the flexible substrate having supporting circuit patterns of said first and second RF saddle coils.

4. An RF imaging coil comprising:
   a first RF coil pair having a first set of two loops of a geometry configured to sandwich a lower abdomen of a human body from anterior and posterior sides with the two loops of the first set facing each other; and
   a second RF coil pair including a second set of two loops of a geometry configured to allow insertion of lower limbs of the human body into the two loops of the second set and configured to sandwich the lower abdomen above the lower limbs from the right and left sides with the two loops of the second set facing each other, wherein said first and second RF coil pairs cooperate during imaging and the second RF coil pair is separated from the first RF coil pair.

5. The RF imaging coil of claim 4, wherein said two loops of the second set in said second RF coil pair have a geometry such that the two loops of the second set are made partially close to and facing each other along a medial line of said human body, wherein a signal-to-noise ratio is improved, and wherein the two loops of the second set have a sensitivity that is improved.

6. The RF imaging coil of claim 4, further comprising: a flexible substrate having a geometry of an underwear shape and configured to fit over the lower abdomen of the human body, and the flexible substrate having supporting circuit patterns of said first and second RF coil pairs.

7. A magnetic resonance imaging apparatus having:
   static magnetic field generating means configured to generate a static magnetic field in a space configured to accommodate a subject to be imaged;

gradient magnetic field generating means configured to generate a gradient magnetic field in said space;

RF signal transmitting/receiving means configured to transmit RF signals to said space and receive RF signals from said space;

said RF signal transmitting/receiving means comprises:
   a first RF saddle coil having a first set of two loop portions of a geometry configured to sandwich a lower abdomen of a human body from anterior and posterior sides with the two loop portions of the first set facing each other; and
   a second RF saddle coil having a second set of two loop portions of a geometry configured to allow insertion of lower limbs of the human body into the two loop portions of the second set and configured to sandwich the lower abdomen above the lower limbs from the right and left sides with the two loop portions of the second set facing each other, wherein said first and second RF saddle coils cooperate during imaging and said second RF saddle coil is separated from said first RF saddle coil;

driving means configured to drive said first and second RF saddle coils in a quadrature scheme;

combining means configured to combine the received RF signals received by said first and second RF saddle coils in a quadrature scheme; and image producing means configured to produce an image based on said received RF signals.

8. The magnetic resonance imaging apparatus of claim 7, further comprising: a flexible substrate having a geometry of an underwear shape and configured to fit over the lower abdomen of the human body, and the flexible substrate having supporting circuit patterns of said first and second RF saddle coils.

* * * * *

UNITED STATES PATENT AND TRADEMARK OFFICE
CERTIFICATE OF CORRECTION

PATENT NO.       : 6,836,117 B2                                   Page 1 of 1
APPLICATION NO.  : 10/414625
DATED            : December 28, 2004
INVENTOR(S)      : Tamura et al.

It is certified that error appears in the above-identified patent and that said Letters Patent is hereby corrected as shown below:

In Claim 4, column 12, line 39, after "coil pair" delete "having" and insert therefor -- including --.

In Claim 4, column 12, line 50, after "coil pair is" delete "separated" and insert therefor -- separate --.

In Claim 7, column 14, line 2, after "saddle coil is" delete "separated" and insert therefor -- separate --.

Signed and Sealed this

Twelfth Day of February, 2008

JON W. DUDAS
*Director of the United States Patent and Trademark Office*